(12) United States Patent
Miki et al.

(10) Patent No.: US 11,706,877 B2
(45) Date of Patent: Jul. 18, 2023

(54) COMPOSITE WIRING SUBSTRATE AND SEMICONDUCTOR DEVICE

(71) Applicant: SHINKO ELECTRIC INDUSTRIES CO., LTD., Nagano (JP)

(72) Inventors: Shota Miki, Nagano (JP); Koyuki Kawakami, Nagano (JP); Kiyoshi Oi, Nagano (JP); Kei Murayama, Nagano (JP); Mitsuhiro Aizawa, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 17/661,585

(22) Filed: May 2, 2022

(65) Prior Publication Data
US 2022/0361342 A1 Nov. 10, 2022

(30) Foreign Application Priority Data
May 10, 2021 (JP) .................................. 2021-079986

(51) Int. Cl.
| | | |
|---|---|---|
| H05K 3/34 | (2006.01) | |
| H01L 23/498 | (2006.01) | |
| H05K 1/11 | (2006.01) | |
| H05K 3/46 | (2006.01) | |

(52) U.S. Cl.
CPC ...... *H05K 3/3463* (2013.01); *H01L 23/49811* (2013.01); *H01L 23/49822* (2013.01); *H05K 1/113* (2013.01); *H05K 3/4644* (2013.01)

(58) Field of Classification Search
CPC .... H05K 3/4644; H05K 1/113; H05K 3/3463; H01L 23/49822; H01L 23/49811
USPC .......................................................... 174/34
See application file for complete search history.

(56) References Cited

U.S. PATENT DOCUMENTS

| | | |
|---|---|---|
| 2011/0100690 A1 | 5/2011 | Yoshimura et al. |
| 2017/0098627 A1 | 4/2017 | Das et al. |
| 2017/0179050 A1 | 6/2017 | Kariyazaki |
| | (Continued) | |

FOREIGN PATENT DOCUMENTS

| | | |
|---|---|---|
| JP | 2010-003878 | 1/2010 |
| JP | 2011-096900 | 5/2011 |
| JP | 2020-205331 | 12/2020 |

OTHER PUBLICATIONS

Extended European Search Report dated Oct. 11, 2022 with respect to the corresponding European patent application No. 22171558.4.

*Primary Examiner* — Tremesha S Willis
(74) *Attorney, Agent, or Firm* — IPUSA, PLLC

(57) ABSTRACT

A composite wiring substrate includes a first wiring substrate including a first connection terminal, a second wiring substrate including a second connection terminal facing the first connection terminal, and a joint material joining the first connection terminal and the second connection terminal. The first outline of the first connection terminal is inside the second outline of the second connection terminal in a plan view. The joint material includes a first portion formed of an intermetallic alloy of copper and tin, and contacting each of the first connection terminal and the second connection terminal, and a second portion formed of an alloy of tin and bismuth, and including a portion between the first outline and the second outline in the plan view. The second portion contains the bismuth at a higher concentration than in the eutectic composition of a tin-bismuth alloy, and is separated from the second connection terminal.

14 Claims, 9 Drawing Sheets

(56) References Cited

U.S. PATENT DOCUMENTS

2021/0022247 A1  1/2021  Ha et al.
2021/0098353 A1  4/2021  Wu et al.

COMPOSITE WIRING SUBSTRATE AND SEMICONDUCTOR DEVICE

CROSS-REFERENCE TO RELATED APPLICATION

This application is based upon and claims priority to Japanese Patent Application No. 2021-079986, filed on May 10, 2021, the entire contents of which are incorporated herein by reference.

FIELD

A certain aspect of the embodiments discussed herein is related to composite wiring substrates and semiconductor devices.

BACKGROUND

A composite wiring substrate including a build-up substrate and an interposer mounted on the build-up substrate is known (see, for example, Japanese Laid-open Patent Publication No. 2020-205331). Furthermore, a tin-bismuth (Sn—Bi) alloy is known as a type of solder (see, for example, Japanese Laid-open Patent Publication Nos. 2010-003878 and 2011-096900).

SUMMARY

According to an embodiment of the present disclosure, a composite wiring substrate includes a first wiring substrate including a first connection terminal, a second wiring substrate including a second connection terminal facing the first connection terminal, and a joint material joining the first connection terminal and the second connection terminal. The first outline of the first connection terminal is inside the second outline of the second connection terminal in a plan view. The joint material includes a first portion formed of an intermetallic alloy of copper and tin, and contacting each of the first connection terminal and the second connection terminal, and a second portion formed of an alloy of tin and bismuth, and including a portion between the first outline and the second outline in the plan view. The second portion contains the bismuth at a higher concentration than in the eutectic composition of a tin-bismuth alloy, and is separated from the second connection terminal.

Figure 1:
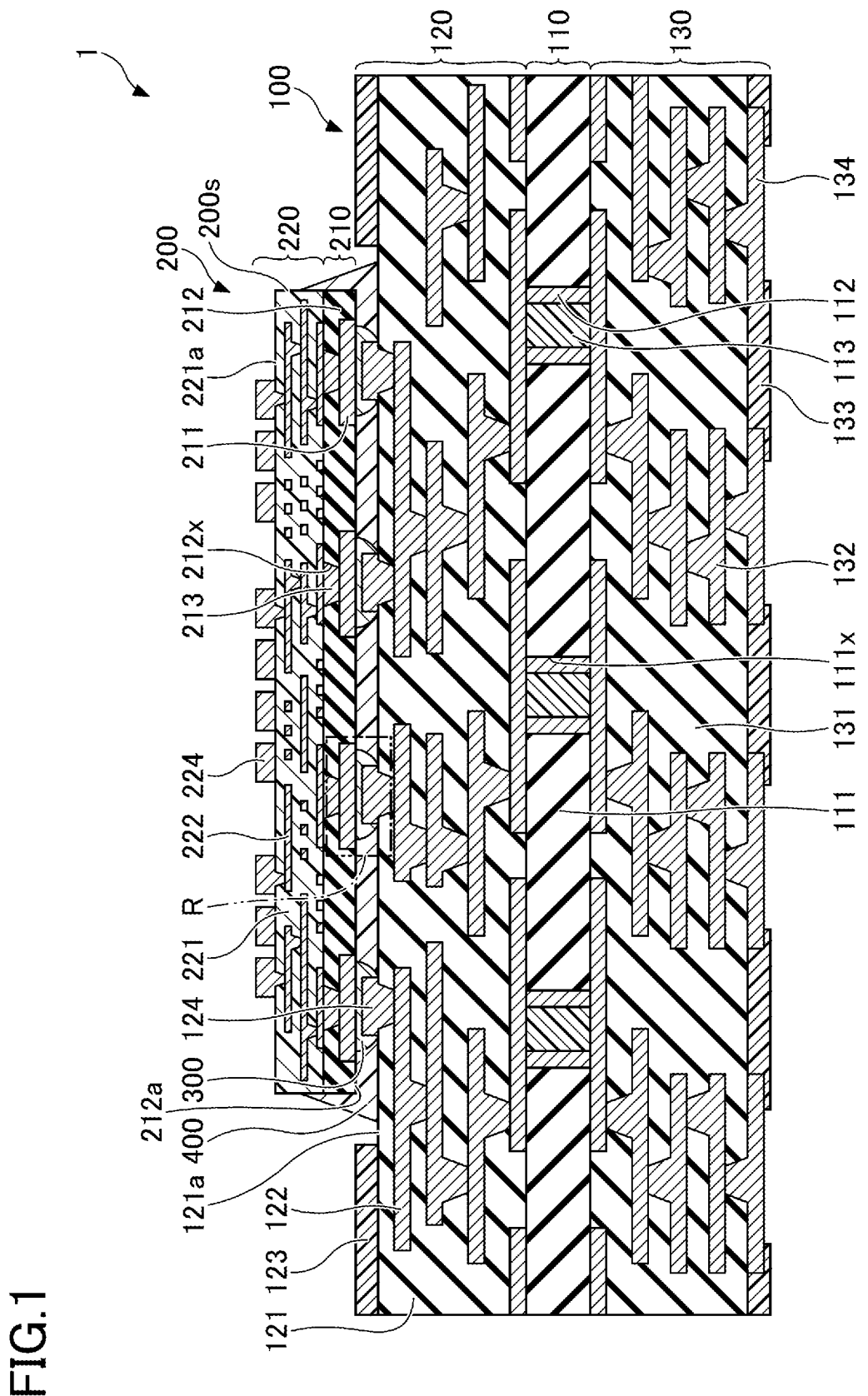
FIG. 1 is a sectional view of a composite wiring substrate according to a first embodiment.

The object and advantages of the invention will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

According to the composite wiring substrate illustrated in Japanese Laid-open Patent Publication No. 2020-205331, while the intended purpose is achieved, a crack may be produced in the vicinity of a joint material between the build-up substrate and the interposer.

According to aspects of the present disclosure, a composite wiring substrate and a semiconductor device according to which cracks can be controlled in the vicinity of a joint material are provided.

Embodiments are specifically described below with reference to the accompanying drawings. In the specification and drawings, elements or components having substantially the same functional configuration are referred to using the same reference numeral, and a duplicate description thereof may be omitted.

[a] First Embodiment

A first embodiment relates to a composite wiring substrate and a method of manufacturing the same.

[Structure of Composite Wiring Substrate]

First, a structure of a composite wiring substrate according to the first embodiment is described. FIG. 1 is a sectional view of a composite wiring substrate 1 according to the first embodiment.

The composite wiring substrate 1 includes a build-up substrate 100, an interposer 200, and a joint material 300. According to the present disclosure, for convenience, a direction in which the interposer 200 is positioned relative to the build-up substrate 100 is defined as an upward direction, and a direction opposite to that direction is defined as a downward direction. Furthermore, a plan view refers to a view of an object taken from a direction perpendicular to the upper surface of the build-up substrate 100. The composite wiring substrate 1, however, may also be used in any position as desired, such as an inverted position.

The build-up substrate 100 includes, for example, a core layer 110, a build-up layer 120 provided on the upper surface of the core layer 110, and a build-up layer 130 provided on the lower surface of the core layer 110. The build-up substrate 100 is an example of a first wiring substrate.

The core layer 110 includes an insulating substrate 111 in which through holes 111x are formed, through conductive vias 112 formed on inner wall surfaces that define the through holes 111x, and a filling material 113 that fills in space inside each through conductive via 112.

The build-up layer 120 includes an insulating layer 121, a wiring layer 122, and a solder resist layer 123. The wiring layer 122 includes electrode pads 124 at an upper surface 121a of the insulating layer 121 (the upper surface of the build-up substrate 100). The material of the wiring layer 122 is, for example, an electrical conductor such as copper (Cu). The electrode pads 124 serve as connection terminals when the build-up substrate 100 is joined to the interposer 200. The electrode pads 124 are an example of a first connection terminal.

The build-up layer 130 includes an insulating layer 131, a wiring layer 132, and a solder resist layer 133. The wiring layer 132 includes electrode pads 134 at the lowermost surface of the insulating layer 131. The material of the wiring layer 132 is, for example, an electrical conductor such as copper. The electrode pads 134 serve as connection terminals when the build-up substrate 100 is joined to an external component such as a motherboard.

The electrode pads 124 and the electrode pads 134 are electrically connected via the wiring layer 122, the through conductive vias 112, and the wiring layer 132. The number of insulating layers 121 and the number of wiring layers 122 included in the build-up layer 120 and the number of insulating layers 131 and the number of wiring layers 132 included in the build-up layer 130 are not limited in particular.

The interposer 200 includes, for example, a first wiring structure 210 and a second wiring structure 220 provided on the upper surface of the first wiring structure 210. The interposer 200 is an example of a second wiring substrate.

The first wiring structure 210 includes electrode pads 211, an insulating layer 212, and conductive vias 213.

The electrode pads 211 are embedded in the insulating layer 212. A lower surface 212a of the insulating layer 212 (the lower surface of the interposer 200) is flush with lower surfaces 211a (FIG. 2B) of the electrode pads 211. Side surfaces 211s (FIG. 2B) of the electrode pads 211 are covered with the insulating layer 212. Via holes 212x are formed in the insulating layer 212, extending from the upper surface of the insulating layer 212 to reach the upper surfaces of the electrode pads 211. The conductive vias 213 are provided in the via holes 212x. The conductive vias 213 contact the electrode pads 211. The upper surface of the insulating layer 212 is flush with the upper surfaces of the conductive vias 213. The material of the electrode pads 211 and the conductive vias 213 is, for example, an electrical conductor such as copper. The electrode pads 211 serve as connection terminals when the interposer 200 is joined to the build-up substrate 100. The electrode pads 211 are an example of a second connection terminal.

The second wiring structure 220 includes an insulating layer 221 and a wiring layer 222. Part of the wiring layer 222 contacts the conductive vias 213. The wiring layer 222 includes electrode pads 224 at an upper surface 221a of the insulating layer 221. The material of the insulating layer 221 is, for example, an organic resin. The material of the wiring layer 222 is, for example, an electrical conductor such as copper. The electrode pads 224 serve as connection terminals when a semiconductor chip is mounted on the interposer 200. The number of insulating layers 221 and the number of wiring layers 222 included in the second wiring structure 220 are not limited in particular.

Figure 2A:
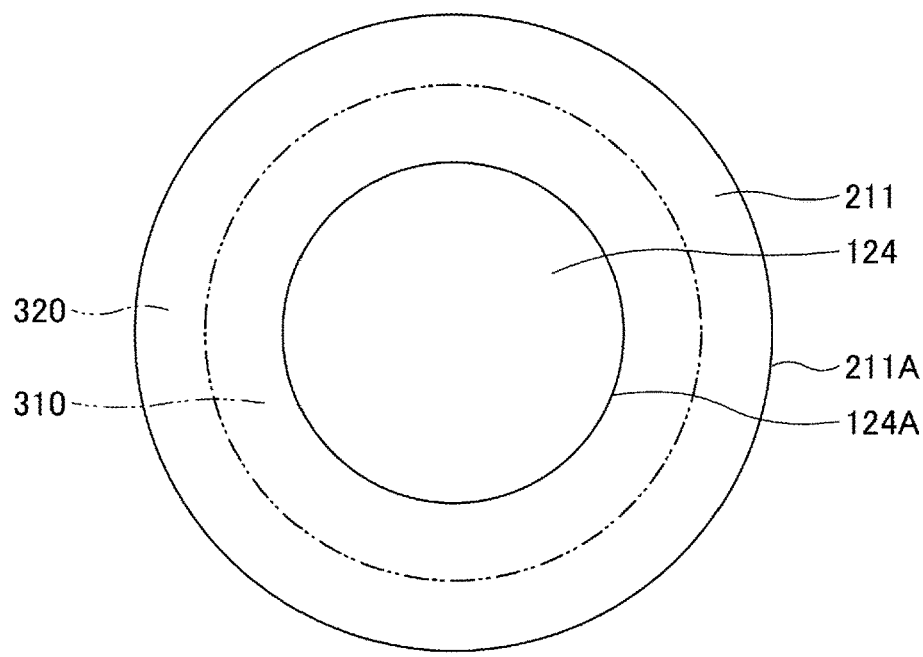
FIGS. 2A and 2B are diagrams for illustrating the positional relationship between electrode pads, a joint material, and other electrode pads according to the first embodiment.
Figure 2B:
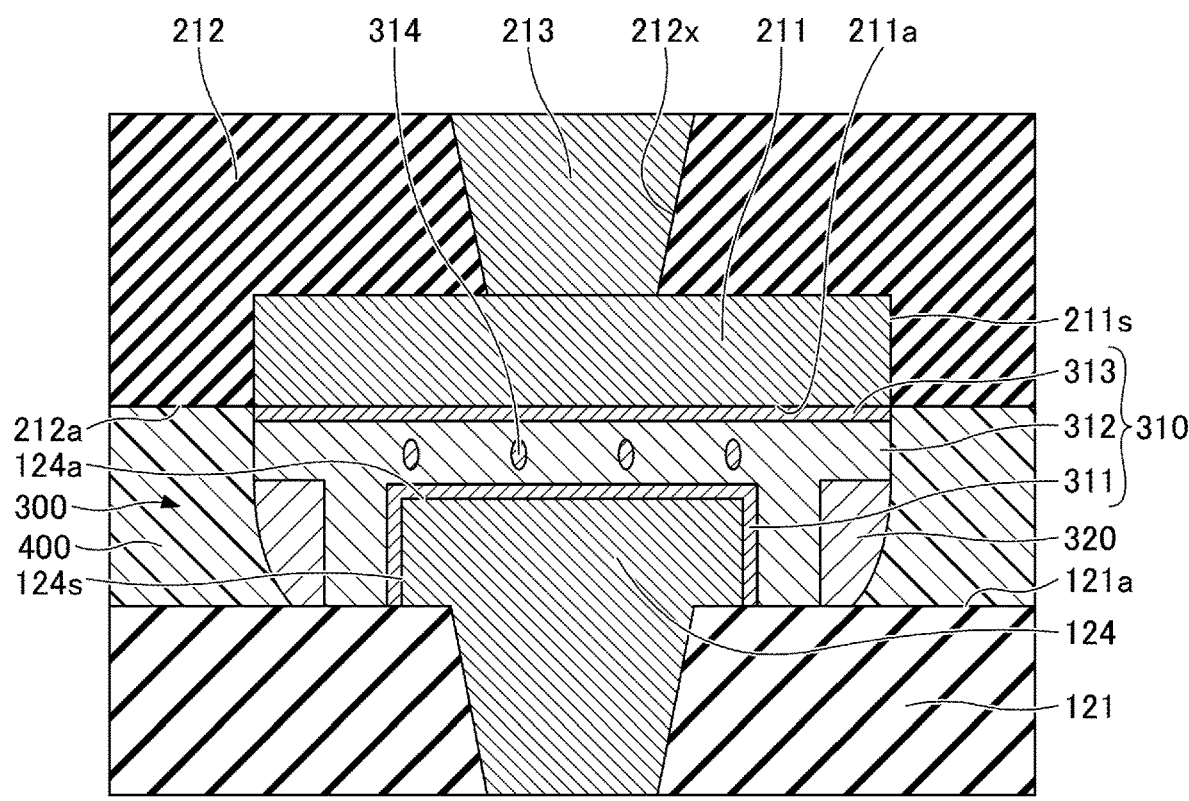

The joint material 300 joins the electrode pads 124 of the build-up substrate 100 and the electrode pads 211 of the interposer 200 together. Here, a configuration of the joint material 300 is described in detail. FIGS. 2A and 2B are diagrams for illustrating the positional relationship between the electrode pads 124, the joint material 300, and the electrode pads 211, taking the electrode pad 124, the joint material 300, and the electrode pad 211 in a region R in FIG. 1 as an example. FIG. 2A is a bottom-side view of the electrode pad 124, the joint material 300, and the electrode pad 211. FIG. 2B is a sectional view of the electrode pad 124, the joint material 300, and the electrode pad 211, which corresponds to an enlarged view of the region R in FIG. 1.

For example, the electrode pad 124 has a circular planar shape having a diameter of 90 µm, and the electrode pad 211 has a circular planar shape having a diameter of 150 µm. In a plan view, the electrode pad 211 and the electrode pad 124 are substantially concentric. Accordingly, in a plan view, an outline 124A of the electrode pad 124 is within (inside) an outline 211A of the electrode pad 211. The outline 124A is an example of a first outline. The outline 211A is an example of a second outline.

The joint material 300 includes a first portion 310 formed of an intermetallic compound of Cu and Sn and a second portion 320 famed of an alloy of Sn and Bi.

The first portion 310 contacts both of the electrode pad 124 of the build-up substrate 100 and the electrode pad 211 of the interposer 200. The first portion 310 also contacts the upper surface 121a of the insulating layer 121. The first portion 310 includes, for example, a $Cu_3Sn$ layer 311, a $Cu_6Sn_5$ layer 312, and a $Cu_3Sn$ layer 313. The $Cu_3Sn$ layer 311 covers an upper surface 124a and a side surface 124s of the electrode pad 124, and the $Cu_3Sn$ layer 313 covers the lower surface 211a of the electrode pad 211. The $Cu_6Sn_5$ layer 312 is between the $Cu_3Sn$ layer 311 and the $Cu_3Sn$ layer 313. The $Cu_6Sn_5$ layer 312 is formed in such a manner as to cover the surface of the $Cu_3Sn$ layer 313 on the build-up substrate 100 side (namely, the lower surface of the $Cu_3Sn$ layer 313). The $Cu_6Sn_5$ layer 312 may contact the build-up layer 120 (the insulating layer 121). Fine Bi particles 314 may be dispersed in the $Cu_6Sn_5$ layer 312.

The second portion 320 includes a portion between the outline 124A of the electrode pad 124 and the outline 211A of the electrode pad 211 in a plan view. The second portion 320 is annularly formed around the electrode pad 124. The first portion 310 is between the second portion 320 and the electrode pad 124 (for example, the side surface 124s). The second portion 320 contains Bi at a higher concentration than in the eutectic composition of a Sn—Bi alloy (namely, than the eutectic Sn—Bi alloy (a Sn—Bi alloy of the eutectic composition)). For example, the proportion of Bi in the second portion 320 is more than or equal to 30% by mass and less than or equal to 85% by mass, preferably more than or equal to 40% by mass and less than or equal to 75% by mass. For example, the melting point of the second portion 320 is lower than the temperature of the second portion 320 during the mounting of a semiconductor chip on the interposer 200. The melting point of the second portion 320 is preferably lower than or equal to 240° C., more preferably lower than or equal to 230° C., and still more preferably lower than or equal to 220° C. The second portion 320 may inevitably contain impurities. The second portion 320 contacts the $Cu_6Sn_5$ layer 312. The first portion 310 lies (intervenes) between the second portion 320 and the electrode pad 211 to prevent the second portion 320 from directly contacting the electrode pad 211. Furthermore, the first portion 310 also lies (intervenes) between the second portion 320 and the electrode pad 124 to prevent the second portion 320 from directly contacting the electrode pad 124. The second portion 320 contacts the upper surface 121a of the insulating layer 121.

A bonding layer 400 is provided between the build-up substrate 100 and the interposer 200 to bond the build-up substrate 100 and the interposer 200 together.

The bonding layer 400 contains, for example, an epoxy resin as a base resin. The bonding layer 400 may cover part of a side surface 200s of the interposer 200.

According to the composite wiring substrate 1 of the first embodiment, the joint material 300 includes the first portion 310 formed on an intermetallic compound of Cu and Sn. Therefore, the first portion 310 has good stiffness. Furthermore, the melting point of the $Cu_3Sn$ layer 311 and the $Cu_3Sn$ layer 313 included in the first portion 310 is 676° C., and the melting point of the $Cu_6Sn_5$ layer 312 included in the first portion 310 is 435° C. The temperature of the joint material 300 during the mounting of a semiconductor chip on the interposer 200 is approximately 250° C., which is lower than the melting points of the first portion 310 by 100° C. or more. Therefore, the first portion 310 is thermally stable during mounting. That is, the joint material 300 can stably maintain high stiffness even with the application of heat during mounting.

Furthermore, the joint material 300 includes the second portion 320 formed of an alloy of Sn and Bi (a non-eutectic Sn—Bi alloy) and containing Bi at a higher concentration than the eutectic Sn—Bi alloy. Therefore, the second portion 320 has good toughness. Furthermore, the second portion 320 includes a portion between the outline 124A of the electrode pad 124 and the outline 211A of the electrode pad 211. During the mounting of a semiconductor chip, with the temperature of the joint material 300 being approximately 250° C. as described above, the second portion 320 melts or softens. Therefore, when a stress is applied to the joint material 300 during mounting, the second portion 320 elastically deforms preferentially to reduce stress concentration on the first portion 310.

Thus, according to the first embodiment, it is possible to control cracks in the vicinity of the joint material 300.

Furthermore, while there is a relatively large difference in the amount of thermal defamation between the build-up substrate 100 and the interposer 200 in a direction perpendicular to the thickness direction (in-plane direction) during the mounting of a semiconductor chip, a thermal stress associated with this difference as well can be reduced by the second portion 320.

Moreover, the second portion 320 famed of an alloy of Sn and Bi is separated (spaced apart) from and out of contact with the electrode pad 211, and the first portion 310 formed of a thermally stable intermetallic compound of Cu and Sn is formed in the vicinity of the electrode pad 211. Therefore, during the mounting of a semiconductor chip, while the electrode pad 211 is significantly affected by heat, the joint material 300 can maintain good thermal stability.

The distance between the electrode pad 124 and the electrode pad 211 is preferably less than or equal to 6 μm. This is because if this distance exceeds 6 μm, it may be difficult to cause the first portion 310 to contact the electrode pad 124 or the electrode pad 211. Furthermore, this distance is more preferably less than or equal to 3 μm. When this distance is less than or equal to 3 μm, substantially the entirety of a portion of the joint material 300 that is inside the outline 124A of the electrode pad 124 in a plan view can be formed of the first portion 310, so that it is possible to achieve particularly good thermal stability. For example, in the portion of the joint material 300 that is inside the outline 124A of the electrode pad 124 in a plan view, the proportion of Bi is preferably less than or equal to 5% by mass, more preferably less than or equal to 3% by mass, and still more preferably less than or equal to 1% by mass.

Furthermore, the volume of the portion of the joint material 300 that is inside the outline 124A of the electrode pad 124 in a plan view is preferably less than or equal to 50%, more preferably less than or equal to 40%, and still more preferably less than or equal to 30% of the volume of a portion of the joint material 300 that is outside the outline 124A of the electrode pad 124 in a plan view.

[Method of Manufacturing Composite Wiring Substrate]

Next, a method of manufacturing the composite wiring substrate 1 according to the first embodiment is described. FIGS. 3A through 3F are sectional views illustrating a method of manufacturing the composite wiring substrate 1 according to the first embodiment.

Figure 3A:
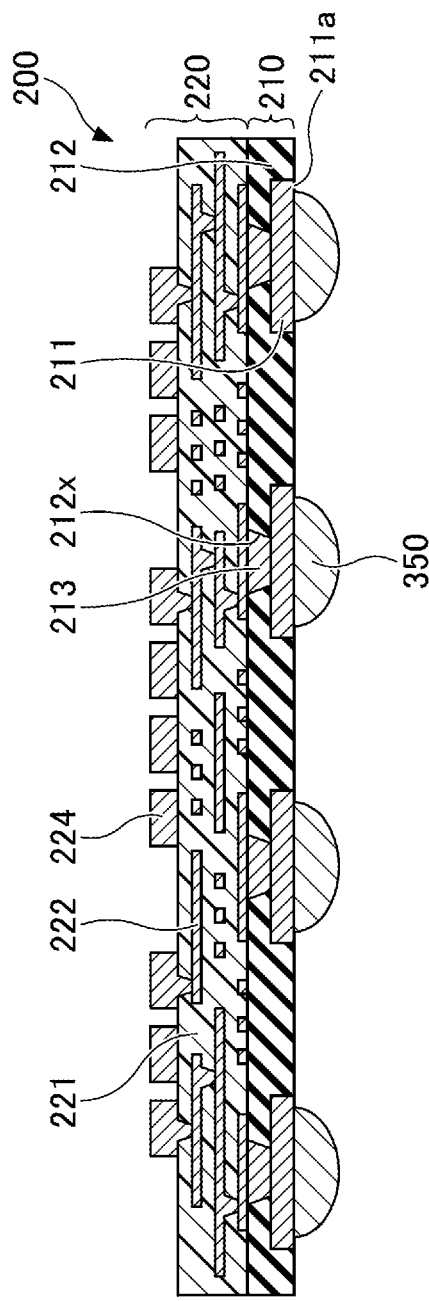
FIGS. 3A through 3F are sectional views illustrating a method of manufacturing the composite wiring substrate according to the first embodiment.

First, as illustrated in FIG. 3A, a Sn—Bi solder material 350 is provided on the lower surfaces 211a of the electrode pads 211 of the interposer 200. For example, the height of the Sn—Bi solder material 350 is approximately 15 μm to approximately 20 μm. Preferably, a Sn—Bi alloy whose proportion of Bi is smaller than in the eutectic Sn—Bi alloy is preferably used as the Sn—Bi solder material 350. For example, the proportion of Bi in the Sn—Bi solder material 350 is 30% by mass to 58% by mass, preferably 30% by mass to 45% by mass. The melting point of the Sn—Bi solder material 350 is, for example, approximately 140° C. The Sn—Bi solder material 350 is an example of a first joint material.

Figure 3B:
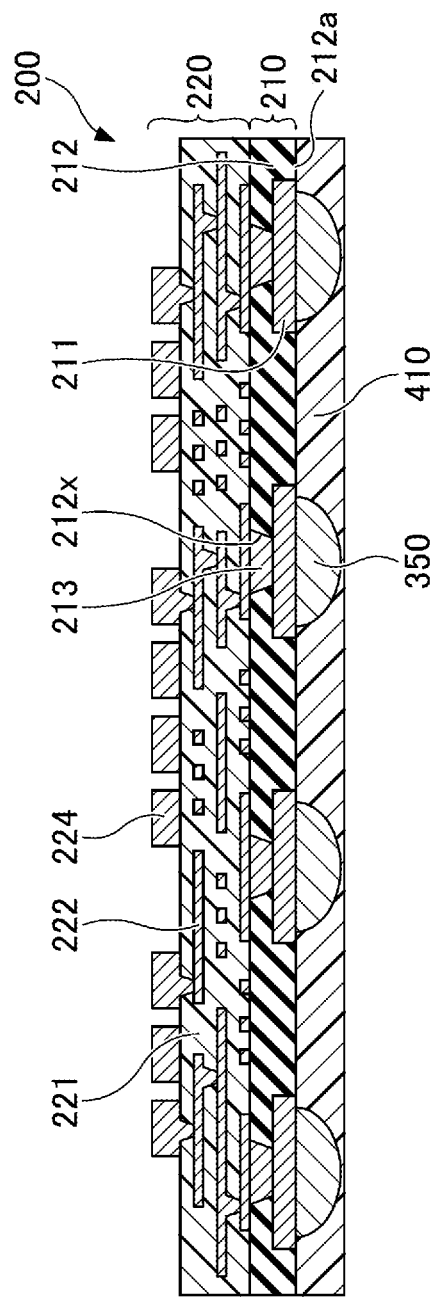

Next, as illustrated in FIG. 3B, a bonding agent (adhesive) 410 is provided on the lower surface of the interposer 200 (the lower surface 212a of the insulating layer 212) in such a manner as to cover the Sn—Bi solder material 350. For example, a non-conductive film (NCF) whose base resin is an epoxy resin may be used as the bonding agent 410.

Figure 3C:
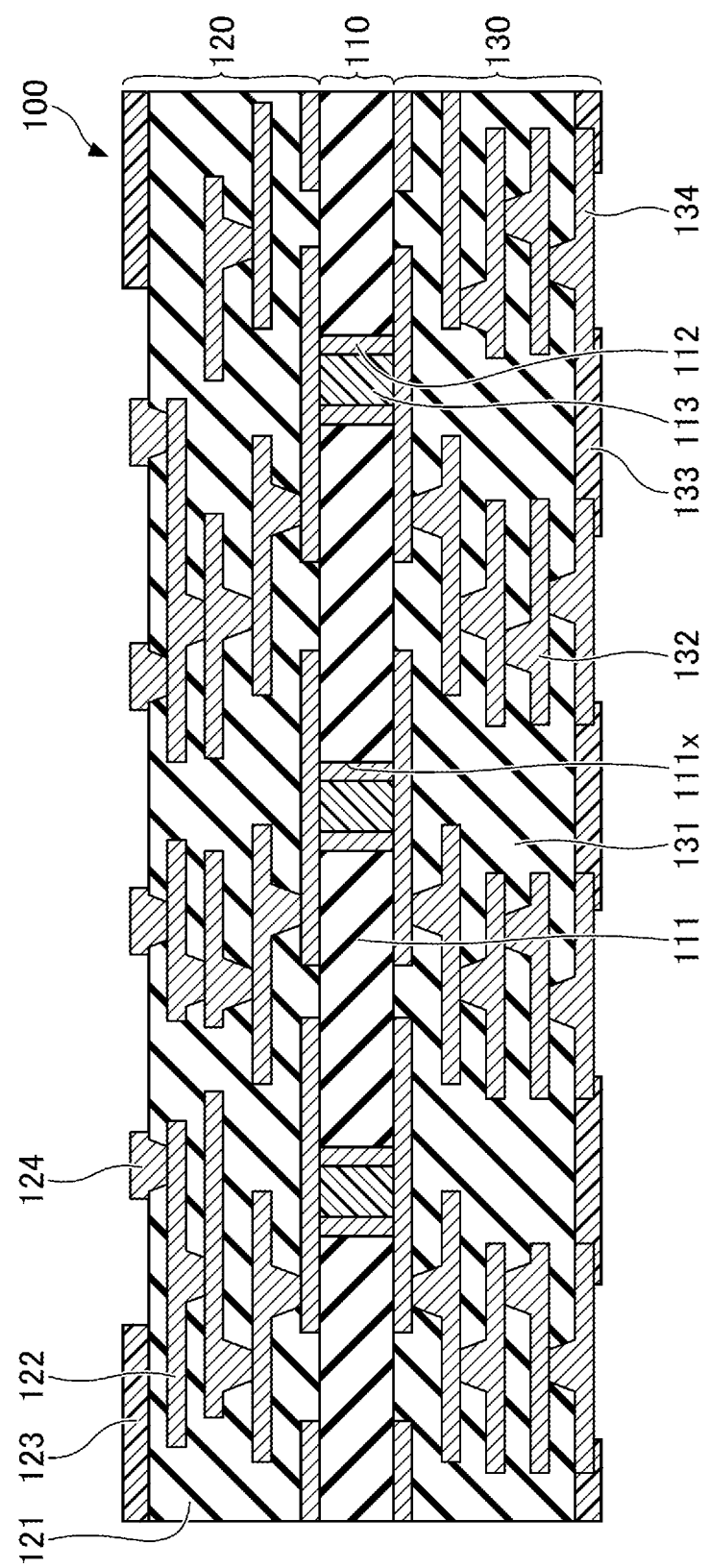

Furthermore, as illustrated in FIG. 3C, the build-up substrate 100 is separately prepared.

Figure 3D:
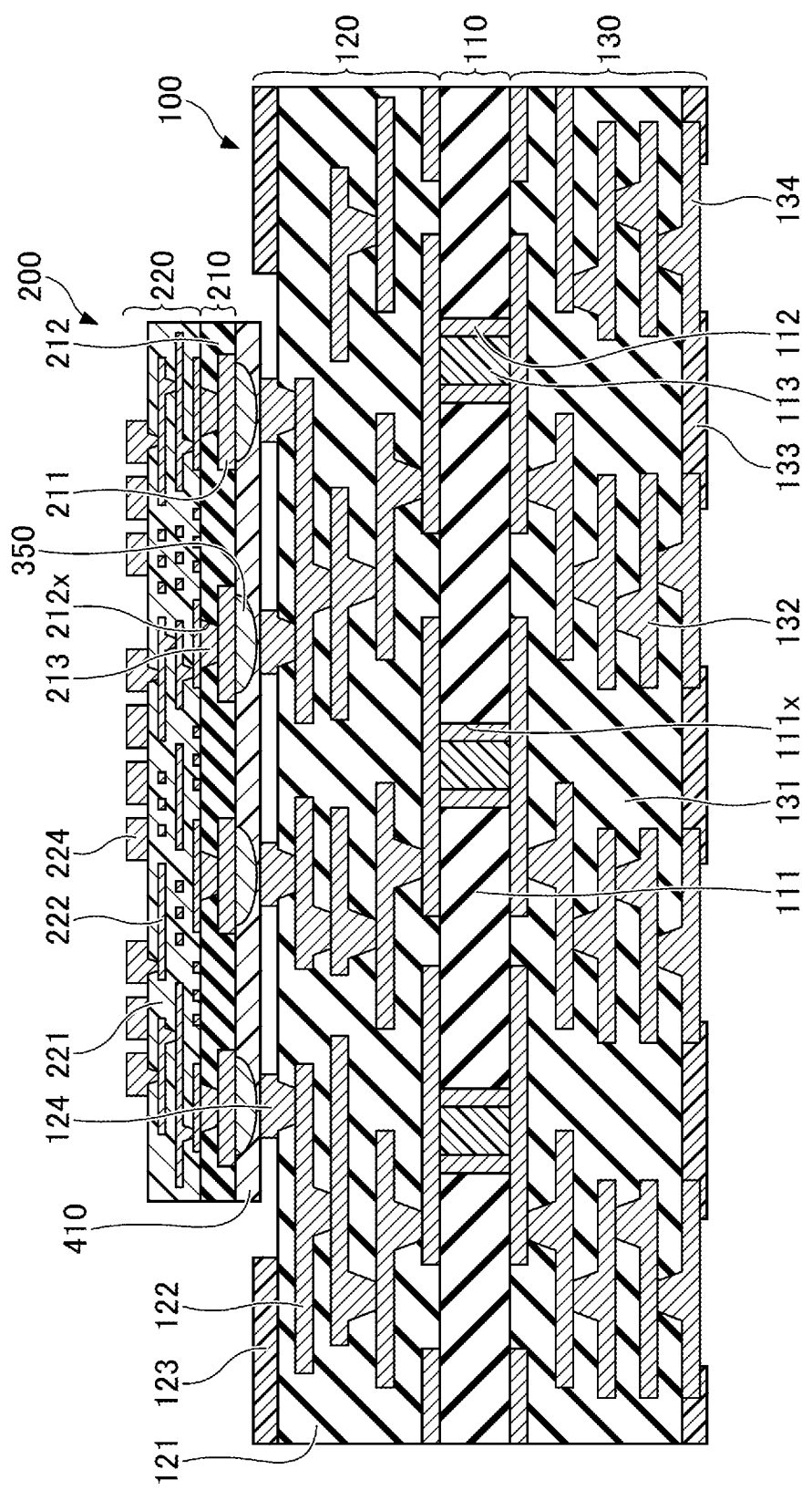

Then, as illustrated in FIG. 3D, the interposer 200 on which the bonding agent 410 is provided is placed on the build-up substrate 100 with the electrode pads 211 facing the electrode pads 124. At this point, the temperature of the Sn—Bi solder material 350 is lower than its melting point. For example, the temperature of the Sn—Bi solder material 350 is approximately 60° C. to approximately 80° C. Furthermore, a load of less than 0.1 MPa is applied between the build-up substrate 100 and the interposer 200 to temporarily fix the interposer 200 to the build-up substrate 100. The load is applied for approximately two seconds, for example.

Figure 3E:
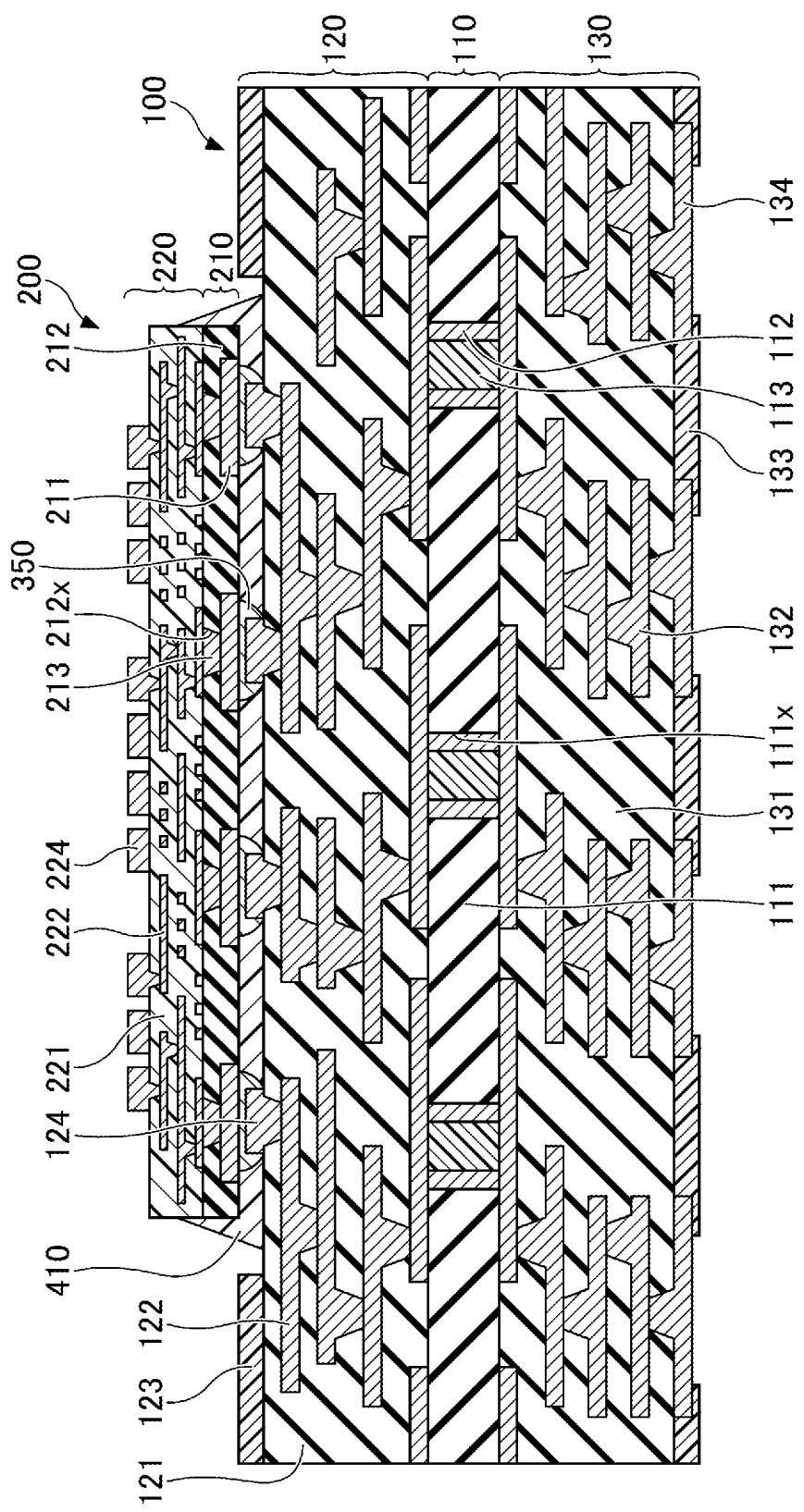

Next, as illustrated in FIG. 3E, the interposer 200 is temporarily compression-bonded to the build-up substrate 100. Specifically, a load of approximately 10 MPa to 20 Mpa is applied between the build-up substrate 100 and the interposer 200 to compress and deform the Sn—Bi solder material 350. At this point, the Sn—Bi solder material 350 is set at a relatively high temperature below the melting point to soften to be easily deformable. For example, the temperature of the Sn—Bi solder material 350 is approximately 100° C. to approximately 120° C. For example, the distance between the electrode pads 124 and the electrode pads 211 after the temporary compression bonding is preferably less than or equal to 6 μm, and more preferably less than or equal to 3 μm. The Sn—Bi solder material 350 is compressed and deformed to reduce the distance between the build-up substrate 100 and the interposer 200, so that the bonding agent 410 protrudes out of the interposer 200 in a plan view. The protruding bonding agent 410 moves up the side surface of the interposer 200 because of surface tension to cover part of the side surface 200s of the interposer 200. The load is applied for approximately 60 seconds, for example.

Figure 3F:
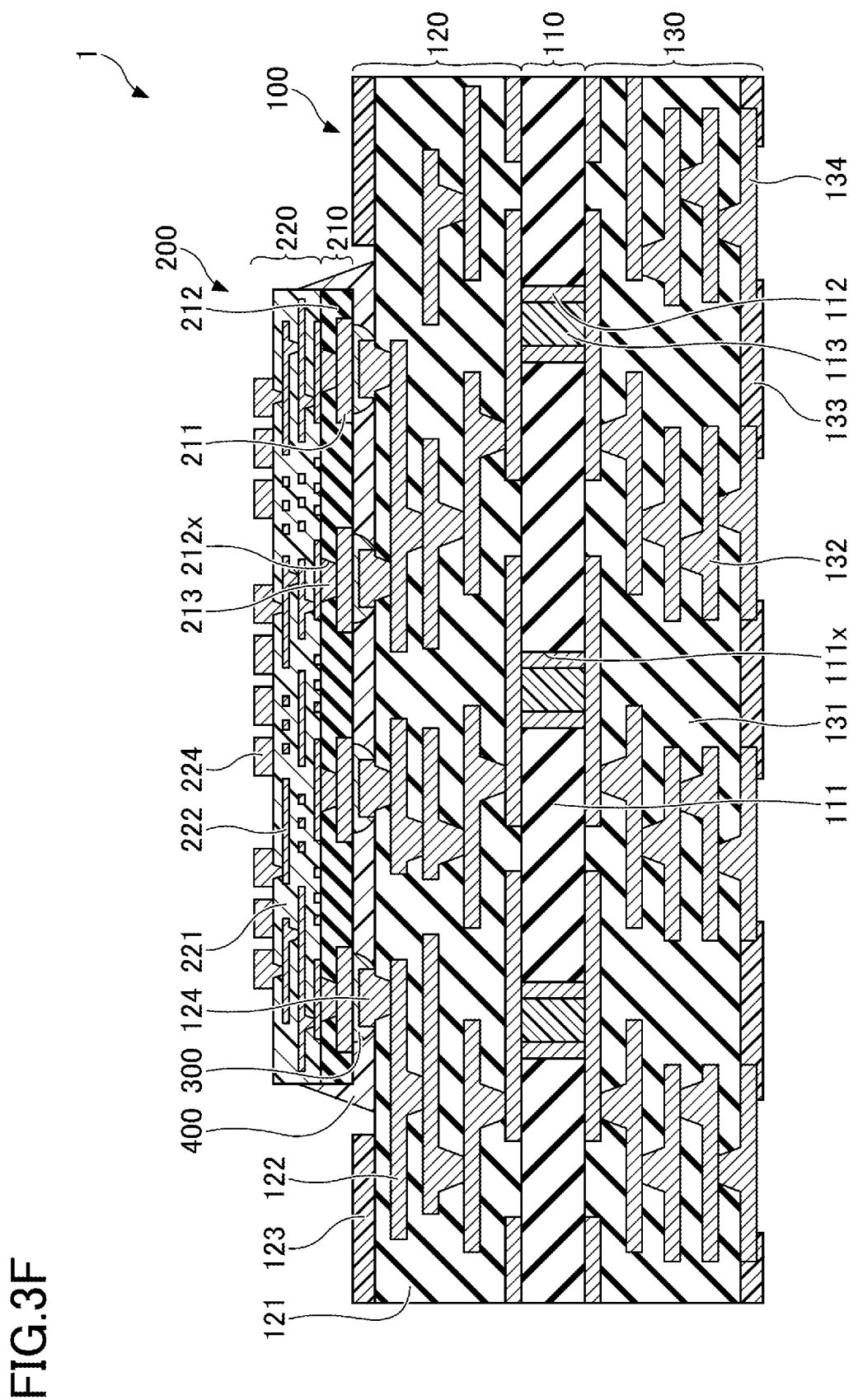

Thereafter, as illustrated in FIG. 3F, the interposer 200 is permanently compression-bonded to the build-up substrate 100. Specifically, with a load of approximately 0.2 MPa to 0.6 MPa being applied between the build-up substrate 100 and the interposer 200, the temperature of the Sn—Bi solder material 350 is increased to be higher than the melting point. For example, the temperature of the Sn—Bi solder material 350 is approximately 180° C. As a result, the Sn—Bi solder material 350 melts. Then, Sn contained in the Sn—Bi solder material 350 reacts with Cu contained in the electrode pads 124 and the electrode pads 211 to form the first portion 310 including the $Cu_3Sn$ layer 311, the $Cu_6Sn_5$ layer 312, and the $Cu_3Sn$ layer 313 in the vicinity of the electrode pads 124 and the electrode pads 211. Furthermore, with the formation of the Cu$_3$Sn layer 311, the Cu$_6$Sn$_5$ layer 312, and the Cu$_3$Sn layer 313, the second portion 320, whose proportion of Bi is higher than in the Sn—Bi solder material 350, is formed apart from the electrode pads 124 and the electrode pads 211. Furthermore, during the permanent compression bonding, the bonding agent 410 is also heated to be cured into the bonding layer 400. The load is applied for approximately 180 seconds, for example.

Thereafter, the application of a load and the application of heat are stopped. As a result, the first portion 310 and the second portion 320 solidify to foam the joint material 300.

In this manner, the composite wiring substrate 1 according to the first embodiment can be manufactured.

Figure 4:
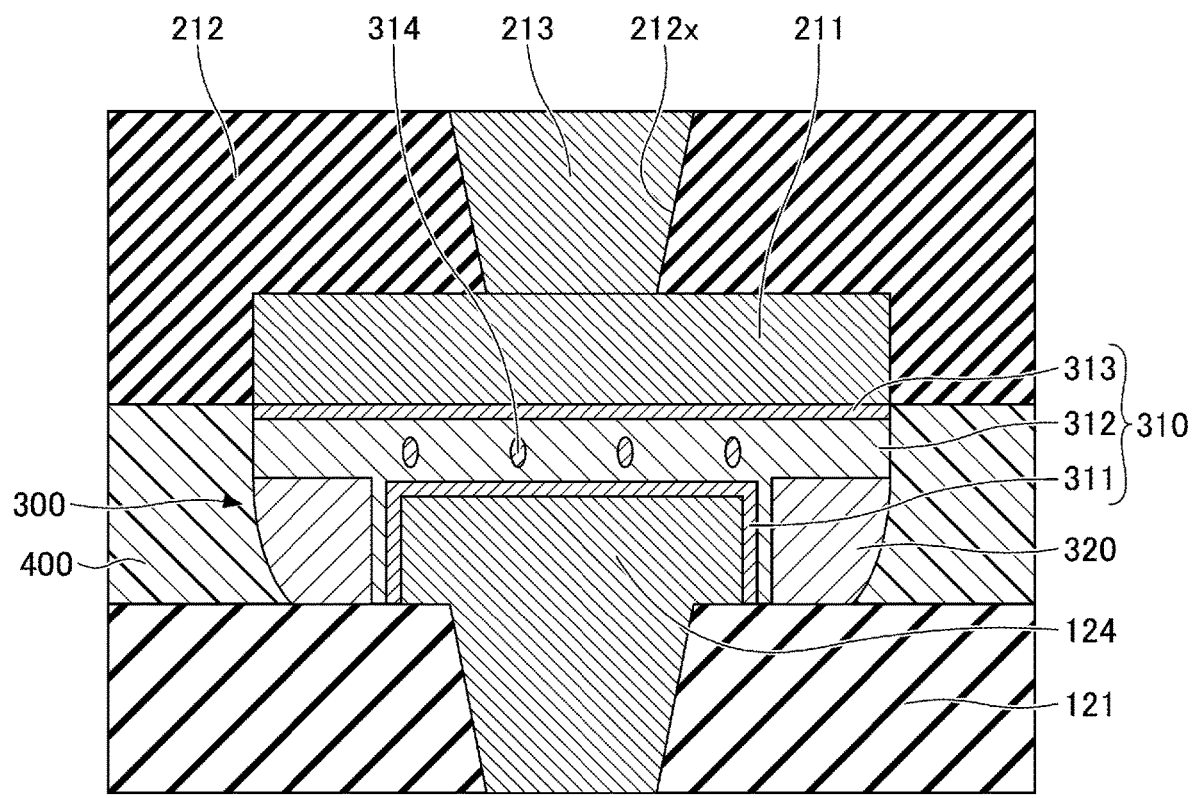
FIG. 4 is a diagram for illustrating the positional relationship between the electrode pads, the joint material, and the other electrode pads according to a variation of the first embodiment.

FIG. 4 is a sectional view of the electrode pad 124, the joint material 300, and the electrode pad 211, illustrating their positional relationship, according to a variation of the first embodiment. As illustrated in FIG. 4, a portion of the first portion 310 between the electrode pad 124 and the second portion 320 may be extremely thinner than a portion of the first portion 310 between the electrode pad 211 and the second portion 320. For example, when the surface of the electrode pad 124 is subjected to surface treatment including Ni plating, the portion of the first portion 310 between the electrode pad 124 and the second portion 320 is likely to be thinner.

[b] Second Embodiment

Figure 5:
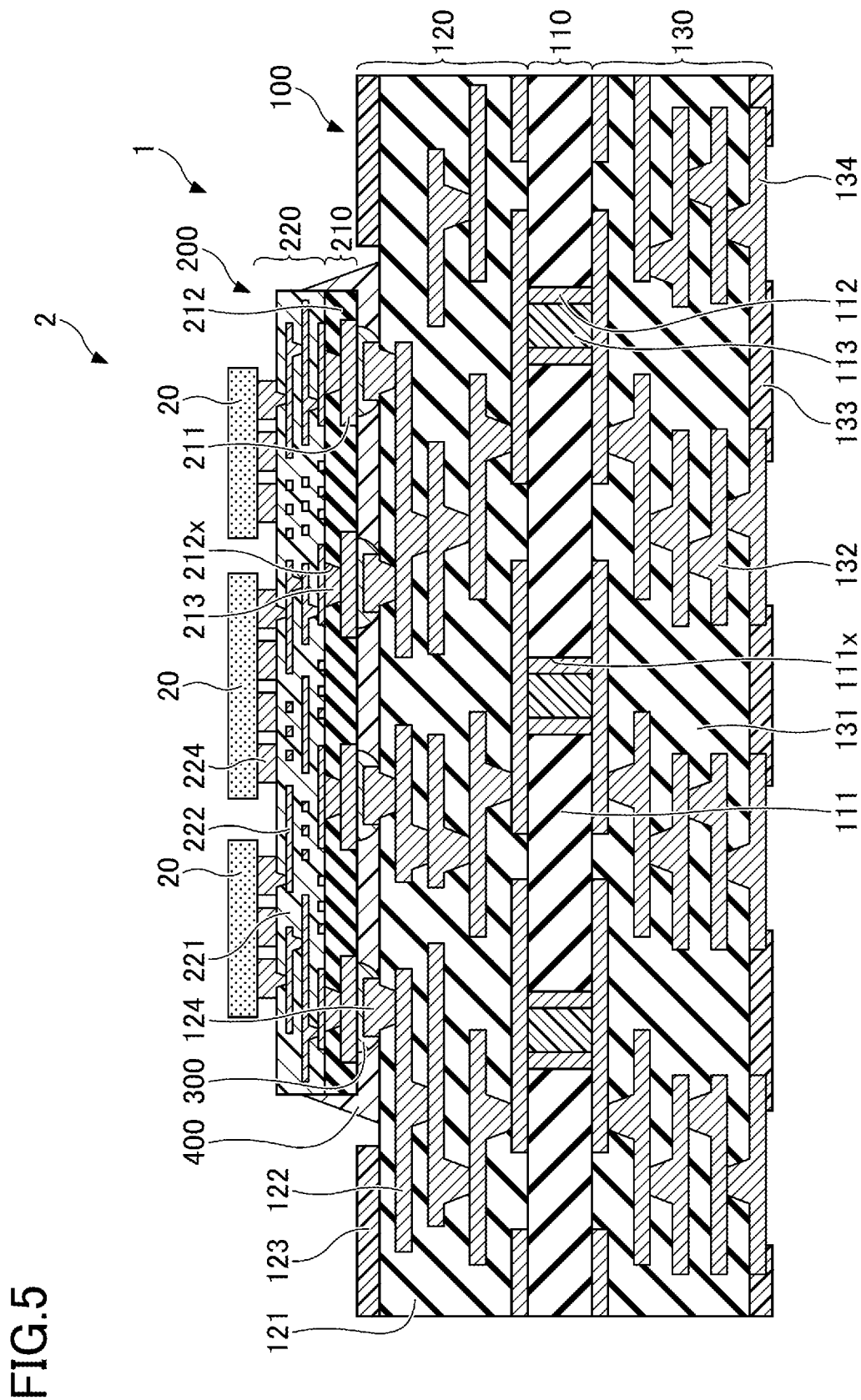
FIG. 5 is a sectional view of a semiconductor device according to a second embodiment.

Next, a second embodiment is described. The second embodiment relates to a semiconductor device. FIG. 5 is a sectional view of a semiconductor device 2 according to the second embodiment.

According to the semiconductor device 2, semiconductor chips 20 are mounted on the interposer 200 of the composite wiring substrate 1 according to the first embodiment. That is, connection terminals (not depicted) provided on the semiconductor chips 20 are connected to the electrode pads 224 via a joint material such as solder. The semiconductor chips 20 are mounted by way of reflow soldering at a temperature of 250° C., for example. During mounting, the semiconductor chips 20 may be pressed toward the composite wiring substrate 1.

According to an embodiment, it is possible to control cracks in the vicinity of a joint material.

All examples and conditional language provided herein are intended for pedagogical purposes of aiding the reader in understanding the invention and the concepts contributed by the inventors to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

Various aspects of the subject matter described herein may be set out non-exhaustively in the following numbered clause:

1. A method of manufacturing a composite wiring substrate, comprising:

preparing a first wiring substrate including a first connection terminal containing copper;

preparing a second wiring substrate including a second connection terminal containing copper;

providing a first joint material containing tin and bismuth on the second connection terminal;

placing the first wiring substrate and the second wiring substrate such that the first connection terminal and the second connection terminal face each other and the first joint material contacts the first connection terminal; and causing the first joint material to react with the first connection terminal and the second connection terminal by heating to form a joint material joining the first connection terminal and the second connection terminal, wherein a first outline of the first connection terminal is inside a second outline of the second connection terminal in a plan view, and the joint material includes a first portion formed of an intermetallic alloy of the copper and the tin, and contacting each of the first connection terminal and the second connection terminal, and a second portion formed of an alloy of the tin and the bismuth, and including a portion between the first outline and the second outline in the plan view, the second portion containing the bismuth at a higher concentration than in a eutectic composition of a tin-bismuth alloy, the second portion being separated from the second connection terminal.

What is claimed is:

1. A composite wiring substrate comprising:
a first wiring substrate including a first connection terminal;
a second wiring substrate including a second connection terminal facing the first connection terminal; and
a joint material joining the first connection terminal and the second connection terminal,
wherein a first outline of the first connection terminal is inside a second outline of the second connection terminal in a plan view, and
the joint material includes
a first portion famed of an intermetallic alloy of copper and tin, and contacting each of the first connection terminal and the second connection terminal, and
a second portion formed of an alloy of tin and bismuth, and including a portion between the first outline and the second outline in the plan view, the second portion containing the bismuth at a higher concentration than in a eutectic composition of a tin-bismuth alloy, the second portion being separated from the second connection terminal.

2. The composite wiring substrate as claimed in claim 1, wherein
the first wiring substrate is a build-up substrate, and
the second wiring substrate is an interposer.

3. The composite wiring substrate as claimed in claim 1, wherein the second connection terminal has a surface facing the first connection terminal, and an entirety of the surface is covered with the first portion.

4. The composite wiring substrate as claimed in claim 1, wherein a proportion of the bismuth in the second portion is more than or equal to 30% by mass and less than or equal to 75% by mass.

5. The composite wiring substrate as claimed in claim 1, wherein a distance between the first connection terminal and the second connection terminal is less than or equal to 6 µm.

6. The composite wiring substrate as claimed in claim 5, wherein the distance between the first connection terminal and the second connection terminal is less than or equal to 3 µm.

7. The composite wiring substrate as claimed in claim 1, wherein a volume of a portion of the joint material inside the first outline in the plan view is less than or equal to 50% of a volume of a portion of the joint material outside the first outline in the plan view.

8. The composite wiring substrate as claimed in claim 1, wherein the second portion is annularly formed around the first connection terminal.

9. The composite wiring substrate as claimed in claim 1, wherein the second wiring substrate includes an insulating layer covering a side surface of the second connection terminal.

10. The composite wiring substrate as claimed in claim 1, wherein a melting point of the second portion is lower than or equal to 240° C.

11. The composite wiring substrate as claimed in claim 1, wherein a proportion of the bismuth is less than or equal to 5% by mass in a portion of the joint material inside the first outline in the plan view.

12. The composite wiring substrate as claimed in claim 1, wherein
  the first connection terminal is at a surface of the first wiring substrate facing the second wiring substrate, and
  the joint material electrically connects the first connection terminal and the second connection terminal, and is in contact with said surface of the first wiring substrate.

13. The composite wiring substrate as claimed in claim 1, wherein
  the first portion intervenes between the second portion and the first connection terminal to cover a side surface of the first connection terminal.

14. A semiconductor device comprising:
  the composite wiring substrate as claimed in claim 1; and
  a semiconductor chip mounted on the second wiring substrate.

* * * * *